(12) United States Patent
Kim et al.

(10) Patent No.: US 9,065,431 B2
(45) Date of Patent: Jun. 23, 2015

(54) STATIC SIGNAL VALUE STORAGE CIRCUITRY USING A SINGLE CLOCK SIGNAL

(71) Applicant: THE REGENTS OF THE UNIVERSITY OF MICHIGAN, Ann Arbor, MI (US)

(72) Inventors: Yejoong Kim, Ann Arbor, MI (US); Michael B. Henry, Ann Arbor, MI (US); Dennis Michael Sylvester, Ann Arbor, MI (US); David Theodore Blaauw, Ann Arbor, MI (US)

(73) Assignee: The Regent of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/860,756

(22) Filed: Apr. 11, 2013

(65) Prior Publication Data

US 2014/0306744 A1      Oct. 16, 2014

(51) Int. Cl.
  *H03K 3/356*       (2006.01)
  *H03K 3/037*       (2006.01)
(52) U.S. Cl.
  CPC .......... *H03K 3/037* (2013.01); *H03K 3/356008* (2013.01)
(58) Field of Classification Search
  CPC ............ H03K 3/35606; H03K 3/356017; H03K 3/356026; H03K 3/037; H03K 3/0375
  USPC .......................... 327/185, 199–219, 223, 224
  See application file for complete search history.

(56) References Cited

U.S. PATENT DOCUMENTS

2008/0054974 A1*  3/2008  Kim ............................. 327/208

OTHER PUBLICATIONS

M. Alioto et al, "Analysis and Comparison in the Energy-Delay-Area Domain of Nanometer CMOS Flip-Flops: Part I—Methodology and Design Strategies" *IEEE Transactions on Very Large Scale Integration (VLSI) Systems*, vol. 19, No. 5, May 2011, pp. 725-736.
M. Alioto et al, "Analysis and Comparison in the Energy-Delay-Area Domain of Nanometer CMOS Flip-Flops: Part II—Results and Figures of Merit" *IEEE Transactions on Very Large Scale Integration (VLSI) Systems*, vol. 19, No. 5, May 2011, pp. 737-750.
E. Consoli et al, "Conditional Push-Pull Pulsed Latches with 726fJ-ps Energy-Delay Product in 65nm CMOS" ISSCC 2012 Session 28 Adaptive & Low-Power Circuits 28.3, 2012, pp. 482-484.
M. Hamada et al, A Conditional Clocking Flip-Flop for Low Power H.264/MPEG-4 Audio/Visual Codec LSI, IEEE 2005 Custom Integrated Circuits Conference, 2005, pp. 527-530.
H. Kaul et al, "Near-Threshold Voltage (NTV) Design—Opportunities and Challenges" Design Automation Conference '49, Jun. 2012, pp. 1149-.
B. Kong et al, "Conditional-Capture Flip-Flop for Statistical Power Reduction" *IEEE Journal of Solid-State Circuits*, vol. 36, No. 8, Aug. 2001, pp. 1263-1271.

(Continued)

*Primary Examiner* — Diana J Cheng
(74) *Attorney, Agent, or Firm* — Nixon & Vanderhye P.C.

(57) ABSTRACT

Signal value storage circuitry 2 is provided which includes a first transistor stack, a second transistor stack and a third transistor stack. The signal value storage circuitry is controlled by a single clock signal. Keeper transistors and isolation transistors serve to permit static operation of the signal value storage circuitry (i.e. the clock signal may be stopped without losing state) and to prevent contention within the circuitry.

10 Claims, 6 Drawing Sheets

(56) References Cited

OTHER PUBLICATIONS

D. Markovic et al, "Analysis and Design of Low-Energy Flip-Flops" ISLPED '01, Aug. 2001, pp. 52-55.

N. Nedovic et al, "Hybrid Latch Flip-Flop with Improved Power Efficiency" IEEE, 2000, pp. 211-215.

C.K. Teh et al, "A 77% Energy-Saving 22-Transistor Single-Phase-Clocking D-Flip-Flop with Adaptive-Coupling Configuration in 40nm CMOS" ISSCC 2011 Session 19 Low-Power Digital Techniques 19.4, pp. 338-340.

C.K. Teh et al, "Conditional Data Mapping Flip-Flops for Low-Power and High-Performance Systems" *IEEE Transactions on Very Large Scale Integration (VLSI) Systems*, vol. 14, No. 12, Dec. 2006, pp. 1379-1383.

J. Yuan et al, "High-Speed CMOS Circuit Technique" *IEEE Journal of Solid-State Circuits*, vol. 24, No. 1, Feb. 1989, pp. 62-70.

\* cited by examiner

STATIC SIGNAL VALUE STORAGE CIRCUITRY USING A SINGLE CLOCK SIGNAL

BACKGROUND OF THE INVENTION

1. Field of the Invention

This invention relates to signal value storage circuitry.

2. Description of the Prior Art

It is known to provide signal value storage circuitry (e.g. transmission gate flip-flop (TGFF) circuitry) that is able to operate statically. Such static signal value storage circuitry is able to maintain a stored signal value when the clock signals are stopped. It is also known to provide dynamic signal value storage circuitry (e.g. true-single-phase-clock (TSPC) flip-flop circuitry), which is able to maintain a signal value while the clocks continue to be driven and typically operates faster, uses less power and requires fewer transistors than static signal value storage circuitry. A problem with static signal value storage circuitry is a requirement for more than one clock signal (e.g. a clock signal and an inverted form of this clock signal which together provide two-phase clocking), as this tends to increase power consumption and reduces clock robustness (e.g. vulnerability to clock skew). Dynamic signal value storage circuitry may be provided using a true single clock signal, but tends to be more vulnerable to variations in process/voltage/temperature which are becoming more significant as process geometries for integrated circuitry reduce in size and operating in voltages reduce. It is also desirable for the gate count of the storage circuitry to be low and that contention should not arise during operation of the storage circuitry.

SUMMARY OF THE INVENTION

Viewed from one aspect the present invention provides a signal value storage circuitry comprising:

a signal input for receiving an input signal value;

a signal output for outputting an output signal value;

a clock signal input for receiving a single clock signal varying between a first clock signal level and a second clock signal level;

a first transistor stack coupled to said signal input and to said clock signal input and configured to drive a primary node bearing a primary node signal to a primary node signal level dependent upon said input signal value while said single clock signal has said first clock signal level;

a second transistor stack coupled to said primary node and to said clock signal input and configured to charge a secondary node bearing a secondary node signal to a charged signal level while said single clock signal has said first clock signal level and, while said single clock signal has said second clock signal level, one of (i) to discharge said secondary node to a discharged signal level if said primary node signal has a first signal level, and (ii) not to discharge said secondary node if said primary node signal has a second signal level;

a third transistor stack coupled to said secondary node, to said clock signal input and to said signal output and configured to drive said output signal value while said clock signal has said second clock signal level to one of: (i) a first output signal level if said secondary node is at said charged signal level, and (ii) a second output signal level if said secondary node is at said discharged signal level; and a secondary-node keeper transistor coupled to said primary node and to said secondary node and configured (i) to drive said secondary node to maintain said charged signal level when said primary node signal has said second signal level and (ii) not to drive said secondary node when said primary node signal has said first signal level.

The present technique provides signal value storage circuitry able to operate with a single clock signal and yet having static operation abilities due to the provision of a secondary-node keeper transistor which can maintain the charge level of the secondary node when the signal level at the primary node indicates this is appropriate.

The static behaviour of the signal value storage circuitry can be further enhanced by the provision of a first primary-node keeper transistor and a second primary-node keeper transistor which can serve to maintain the primary node signal without a requirement for continuous clocking of the signal value storage circuitry.

Power consumption and robustness of the signal value storage circuitry may be improved by the provision of a first-stack isolation transistor within the first transistor stack and a third-stack isolation transistor within the third transistor stack serving to prevent inappropriate and undesired driving of signals by their respective transistor stacks and thereby avoiding contention within the signal value storage circuitry.

The static behaviour of the signal value storage circuitry is further enhanced by the provision of output feedback circuitry serving to maintain the output signal during one phase of the single clock signal and to allow the output signal to be changed during a different phase of the single clock signal without contention, e.g. without requiring a feedback loop to be overpowered.

Viewed from another aspect the present invention provides signal value storage circuitry comprising:

signal input means for receiving an input signal value;

signal output means for outputting an output signal value;

clock signal input means for receiving a single clock signal varying between a first clock signal level and a second clock signal level;

first transistor stack means, coupled to said signal input means and to said clock signal input means, for driving primary node means for bearing a primary node signal to a primary node signal level dependent upon said input signal value while said single clock signal has said first clock signal level;

second transistor stack means, coupled to said primary node means and to said clock signal input means, for charging secondary node means for bearing a secondary node signal to a charged signal level while said single clock signal has said first clock signal level and, while said single clock signal has said second clock signal level, one of (i) discharging said secondary node means to a discharged signal level if said primary node signal has a first signal level, and (ii) not discharging said secondary node means if said primary node signal has a second signal level;

third transistor stack means, coupled to said secondary node means, to said clock signal input means and to said signal output means, for driving said output signal value while said clock signal has said second clock signal level to one of: (i) a first output signal level if said secondary node means is at said charged signal level, and (ii) a second output signal level if said secondary node means is at said discharged signal level; and secondary-node keeper transistor means, coupled to said primary node means and to said secondary node means, for (i) driving said secondary node means to maintain said charged signal level when said primary node signal has said second signal level and (ii) not driving said secondary node means when said primary node signal has said first signal level.

Viewed from a further aspect the present invention provides a method of storing a signal value within signal value storage circuitry, said method comprising the steps of:

receiving an input signal value at a signal input;

receiving at a clock signal input a single clock signal varying between a first clock signal level and a second clock signal level;

driving, with a first transistor stack coupled to said signal input and to said clock signal input, a primary node bearing a primary node signal to a primary node signal level dependent upon said input signal value while said single clock signal has said first clock signal level;

charging, with a second transistor stack coupled to said primary node and to said clock signal input, a secondary node bearing a secondary node signal to a charged signal level while said single clock signal has said first clock signal level and, while said single clock signal has said second clock signal level, one of (i) discharging said secondary node to a discharged signal level if said primary node signal has a first signal level, and (ii) not discharging said secondary node if said primary node signal has a second signal level;

driving, with a third transistor stack coupled to said secondary node, to said clock signal input and to a signal output, an output signal value while said clock signal has said second clock signal level to one of: (i) a first output signal level if said secondary node is at said charged signal level, and (ii) a second output signal level if said secondary node is at said discharged signal level;

outputting said output signal value at said signal output; and with a secondary-node keeper transistor coupled to said primary node and to said secondary node (i) driving said secondary node to maintain said charged signal level when said primary node signal has said second signal level and (ii) not driving said secondary node when said primary node signal has said first signal level.

The above, and other objects, features and advantages of this invention will be apparent from the following detailed description of an illustrative embodiment which is to be read in connection with the accompanying drawings.

DESCRIPTION OF THE EMBODIMENTS

Figure 1:
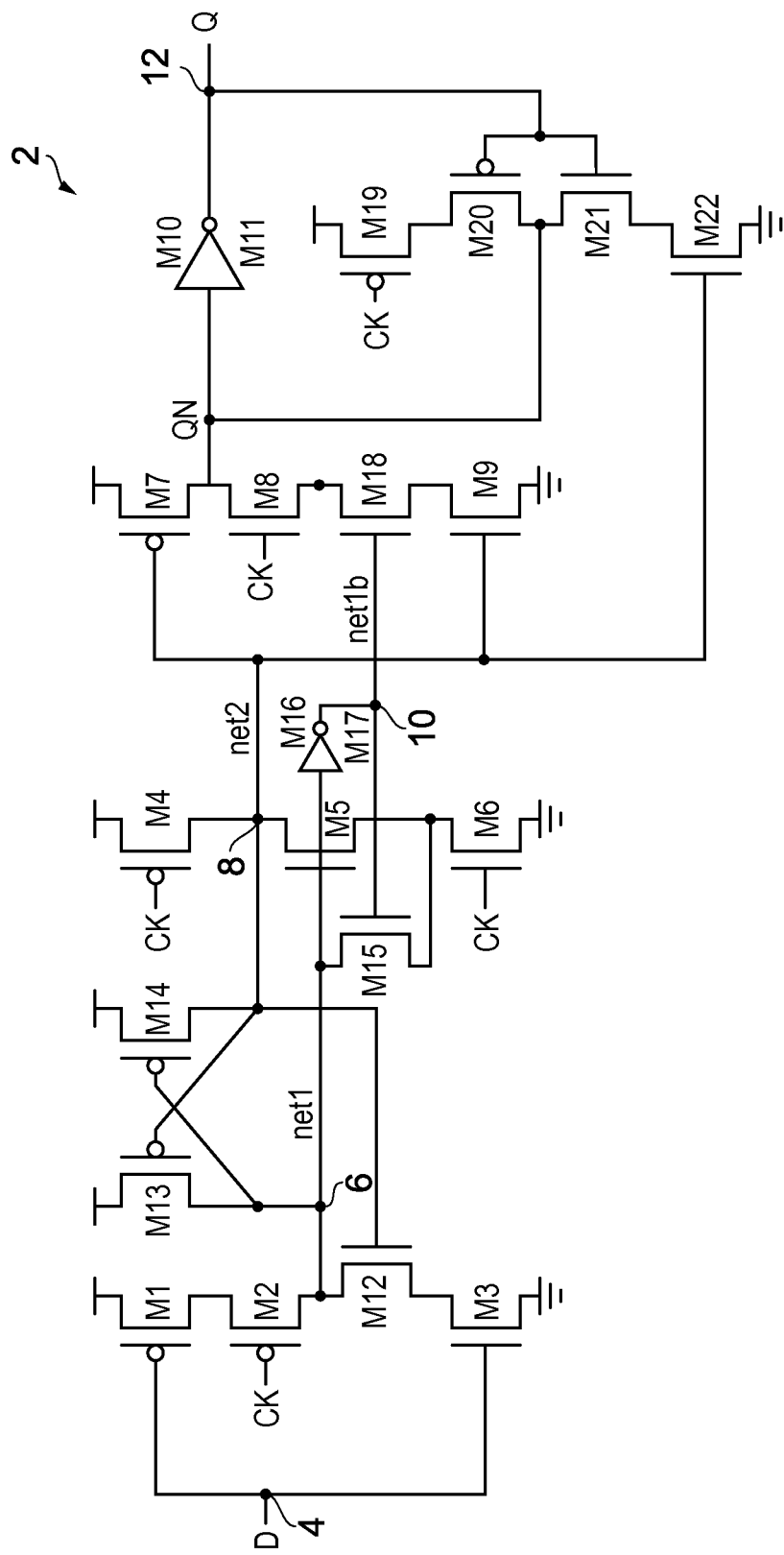
FIG. 1 schematically illustrates signal value storage circuitry in accordance with one example embodiment of the present invention.

FIG. 1 schematically illustrates signal value storage circuitry 2. The signal value storage circuitry 2 includes a first transistor stack M1, M2, M12 and M3 which receives an input signal value D at a signal input 4 and a single clock signal CK from a clock signal input. The clock signal input is shown attached to various transistors within the signal value storage circuitry in FIG. 1. These transistors are M2, M4, M6, M8 and M19. The gate electrodes of all of these transistors M2, M4, M6, M8 and M19 are all connected to a common clock signal input and receive the single clock signal which varies between a first clock signal level (low) and a second clock signal level (high).

The signal value storage circuitry 2 further comprises a second transistor stack M4, M5 and M6 and a third transistor stack is formed of transistors M7, M8, M18 and M9.

A primary node 6 bears a primary node signal net1. A secondary node 8 bears a secondary node signal net2. The primary node signal net1 varies between a first signal level (high) and a second signal level (low). The secondary node signal net2 varies between a charged signal level (high) and a discharged signal level (low).

The signal value storage circuitry 2 includes a signal output 12 for outputting an output signal Q. Output feedback circuitry formed of transistors M19, M20, M21 and M22 serves to maintain the output signal Q when the clock signal CK is at the first clock signal level (low). When the clock signal CK is at its second clock signal level (high), the output feedback circuitry M19, M20, M21 and M22 permits a change in the output signal Q to be made without contention arising, i.e. the output feedback circuitry does not need to be overpowered in order to change the output signal Q when the clock signal CK is at the second clock signal level (high).

A secondary-node keeper transistor M14 is provided coupled to the secondary node 8 and with its gate electrode coupled to the primary node 6. The action of the secondary-node keeper transistor M14 is to drive the secondary node 8 to maintain a charged signal level when the primary node signal has the second signal level (low) and not to drive the secondary node when the primary node signal has the first signal level (high).

A first primary-node keeper transistor M13 is connected to the primary node 6 with its gate electrode coupled to the secondary node 8. The first primary-node keeper transistor M13 serves to drive the primary node 6 to maintain the first signal level (high) when the secondary node 8 is discharged (low) and does not drive the primary node 6 when the secondary node 8 is charged (high).

A second primary node keeper transistor M15 is coupled to the primary node 6 with its gate electrode coupled to a node 10 which carries an inverted version of the primary node signal. The second primary-node keeper transistor M15 acts while the clock signal level CK is high (second clock signal level) to drive the primary node 6 to maintain a second signal level (low) when the primary node signal is at that second signal level. When the clock signal CK is low (first clock signal level), the second primary-node keeper transistor M15 does not drive the primary node 6.

The first transistor stack M1, M2, M12 and M3 includes a first-stack isolation transistor M12 which has its gate electrode coupled to the secondary node 8. The first-stack isolation transistor M12 serves to prevent the first transistor stack M1, M2, M12 and M3 driving the primary node 6 to the second signal level (low) when the secondary node 8 is at the discharged signal level (low). This helps avoid contention arising in the driving of the primary node 6.

Role of M12 and M15

When CK is low and D is low, net1 becomes high, and net2 is precharged to high. After CK has a low-to-high transition, net2 becomes discharged to ground through M5 and M6. This discharged net2 also turns on M13, driving net1 high. M15 is off because net1 is high. D can change anytime while CK is high. If D has a low-to-high transition while CK is high, it will turn on M3. M12 was not present, there would have been a short-circuit current through M13, M12, and M3. Thus, M12 prevents this short-circuit current; the discharged net2 turns off M12.

When CK is low and D is high, net1 becomes low, and net2 is precharged high. After CK has a low-to-high transition, net2 stays high, since M14 is on. In this case, M12 is also on, because net2 is high. If D has a high-to-low transition, it will turn off M3. In this case, M15 keeps net1 low (through M6). M12 has no effect here, since M3 is off, isolating the first stack from ground. M2 is also off, isolating the stack from VDD.

The third transistor stack M7, M8, M18 and M9 includes a third-stack isolation transistor (M18) which has its gate electrode coupled to an inverted version of the primary node signal. The third-stack isolation transistor M18 serves to prevent the third transistor stack M7, M8, M18, M9 from driving the output signal Q toward the high level (preceding node QN to a low level) while the secondary node 8 is being discharged from the charged signal level (high) to the discharge signal level (low). This prevents an unwanted glitch at QN and Q, and hence reduces power consumption.

Role of M18

Figure 2:
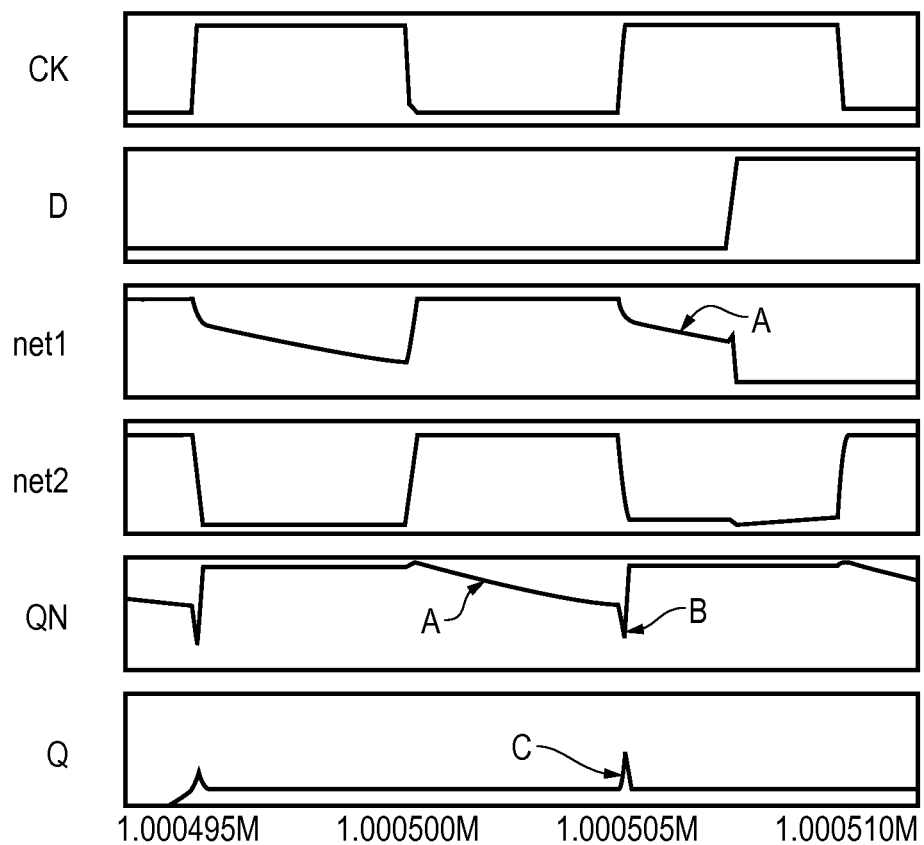
FIG. 2 illustrates a glitch that can occur in dynamic true-single-phase-clock flip-flop circuitry.

If M18 is not present in the third stack, then this can cause a glitch in particular situations. Consider a modified version of FIG. 1 in which none of M12 to M22 are present and which operates as a dynamic true-single-phase clock flip-flop. Assume that D stays low for a multiple clock cycles. When CK is low, net1 becomes high, and net2 is precharged high. Both M7 and M8 are off, making QN floating (in Dynamic TSPC flip-flop). Since D has stayed low for a multiple clock cycles, QN must be high (so the output Q is low). Now, CK has a low-to-high transition, turning on M6 and M8 at the same time. Thus, net2 is discharged through M6. QN must stay high, but, since net2 was initially high right after that CK transition low-to-high, QN starts to discharge through M8 and M9. After net2 becomes discharged, it will turn off M9 and turn on M7, so QN will be charged to high again, so the functionality should be fine. However, this voltage drop (glitch) at QN is undesirable since it consumes unnecessary power and also negatively affects the maximum operating frequency achievable. FIG. 2 depicts this glitch problem.

The mark A in net1 and QN indicates the slow discharge due to leakage, since this is a dynamic circuit, these nodes are floating. The mark B in QN shows the abovementioned glitch. As soon as CK goes high, QN starts discharging since net2 is initially high. After net1 discharges net2 through M5, QN becomes charged again through M7, making the glitch. This glitch also affects the final output Q, as shown as another glitch marked as C in Q.

In FIG. 1, the static TSPC has M18 in the third stack, and this eliminates this glitch. Since net1 stays high, net1b stays low, turning off M18, and this isolates QN from ground. Although net2 is still initially high right after the CK transition low-to-high, there is no path from QN to ground. Thus, QN just stays high, and M7 starts strongly keeping QN high once net2 becomes discharged. Thus, the static TSPC does not have the unnecessary glitch.

Thus, in terms of functionality/robustness, M18 is optional; the circuit of FIG. 1 is robust and operates without M18, although the glitch would appear. The benefit of adding M18 is that it eliminates the unnecessary glitch hence reducing the power consumption.

M19-M22 provide 'conditional-gating'. Usually, in this kind of output feedback structures, the gate of the M22 would be connected to the inverted clock signal, and so M22 would keep being turned on/off whenever there was a clock transition. Also, the circuit would not be a single-phase circuit anymore. However, in the circuit of FIG. 1, the gate of M22 is connected to net2, which has data-dependent transitions. For example, if D stays high for a multiple clock cycles, then net1 stays low, and net2 stays high without any active transition. Thus, M22 stays on regardless of the clock state. Since QN stays low in this case, M22 does not have to be turned off. This conditional-gating helps reduce the power consumption.

Figure 3:
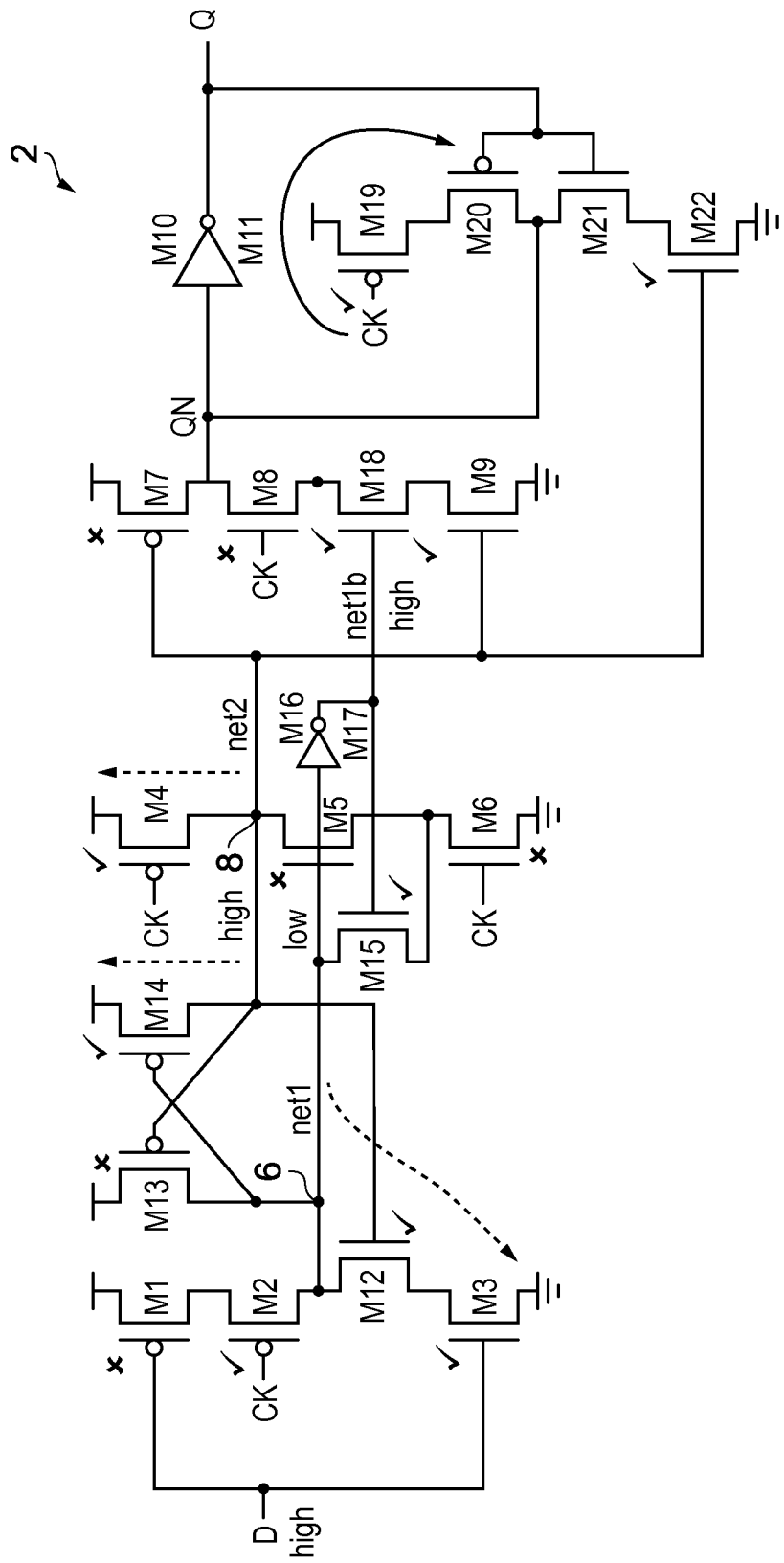
FIGS. 3 to 6 schematically illustrate the operation of the signal value storage circuitry of FIG. 1 with different input signal values and with different clock signal levels.

FIGS. 3, 4, 5 and 6 illustrate the operation of the signal value storage circuitry 2 with various combinations of clock signal level CK and input signal level D. FIG. 3 illustrates the situation in which the input signal level D is high and the clock signal CK is low (first clock signal level). In this state, whether the various transistors M1 to M22 are conductive or not conductive is indicated respectively by a tick or a cross next to those transistors.

The net combination of the action of the transistors illustrated in FIG. 3 is that the primary node 6 is driven low through transistors M12 and M3 to reflect the high input signal D. At the same time, the secondary node 8 is precharged high through transistors M4 and M14. During this phase of the clock signal CK (low—first clock signal level), the output feedback circuitry provided by transistors M19, M20, M21 and M22 serves to maintain the output signal value Q through feedback around the inverter provided by transistors M10 and M11.

Figure 4:
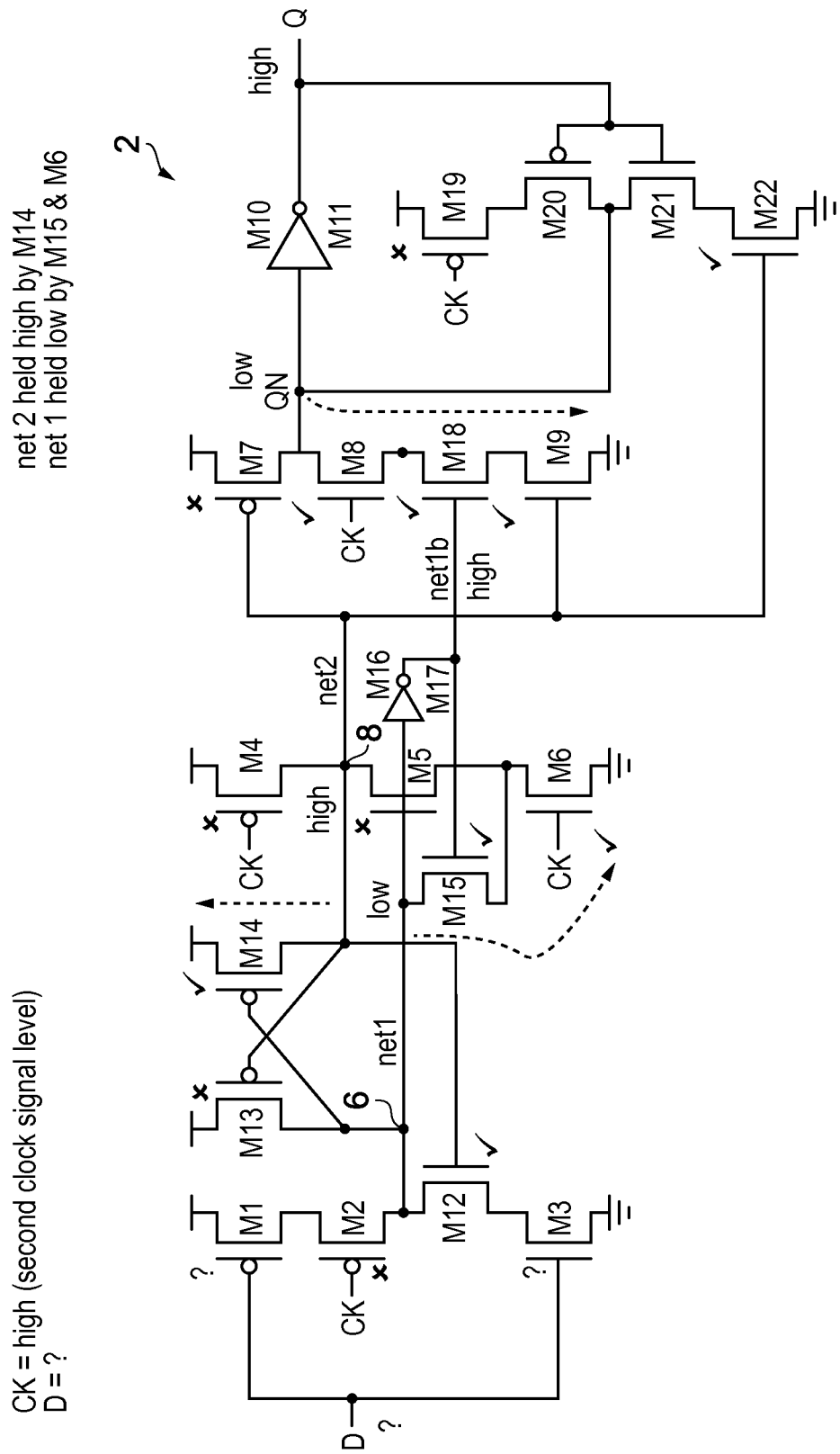

FIG. 4 illustrates the action of the signal value storage circuitry 2 when the clock signal CK transitions high (second clock signal level) following the receipt of a high input signal D as illustrated in FIG. 3. As explained in relation to FIG. 3, the primary node 6 has been driven low and the secondary node 8 has been precharged high during the state illustrated in FIG. 3. As illustrated in FIG. 4, the second primary-node keeper transistor M15 serves to hold the primary node signal net1 low during the period of operation of FIG. 4. At the same time, the secondary node signal net2 is held high through the action of the secondary-node keeper transistor M14. During the operation illustrated in FIG. 4, the input signal D can vary without changing the primary node signal net1 or the secondary node signal net2. The transistor M2 within the first transistor stack is non-conductive by virtue of the high signal level of the clock signal CK and accordingly the primary node signal cannot be pulled high. The primary node signal is already low and so will be unchanged if the input signal D is such that the first transistor stack M1, M2, M12 and M3 tries to pull the primary node signal low through transistors M12 and M3.

Also illustrated in FIG. 4 is the output signal Q being driven to a signal level dependent upon the secondary node signal net2 via the third transistor stack M7, M8, M18 and M9, i.e. driven low. While the third transistor stack M7, M8, M18 and M9 is driving the output signal Q in this way, the output feedback circuitry M19, M20, M21 and M22 is disabled from contending with the change being made as the transistor M19 is non-conductive and may assist in pulling the node QN low via conduction through the transistors M20, M21 and M22 if the output signal value Q was already high or once the output signal value becomes sufficiently high to switch on these transistors M20, M21 and M22.

Figure 5:
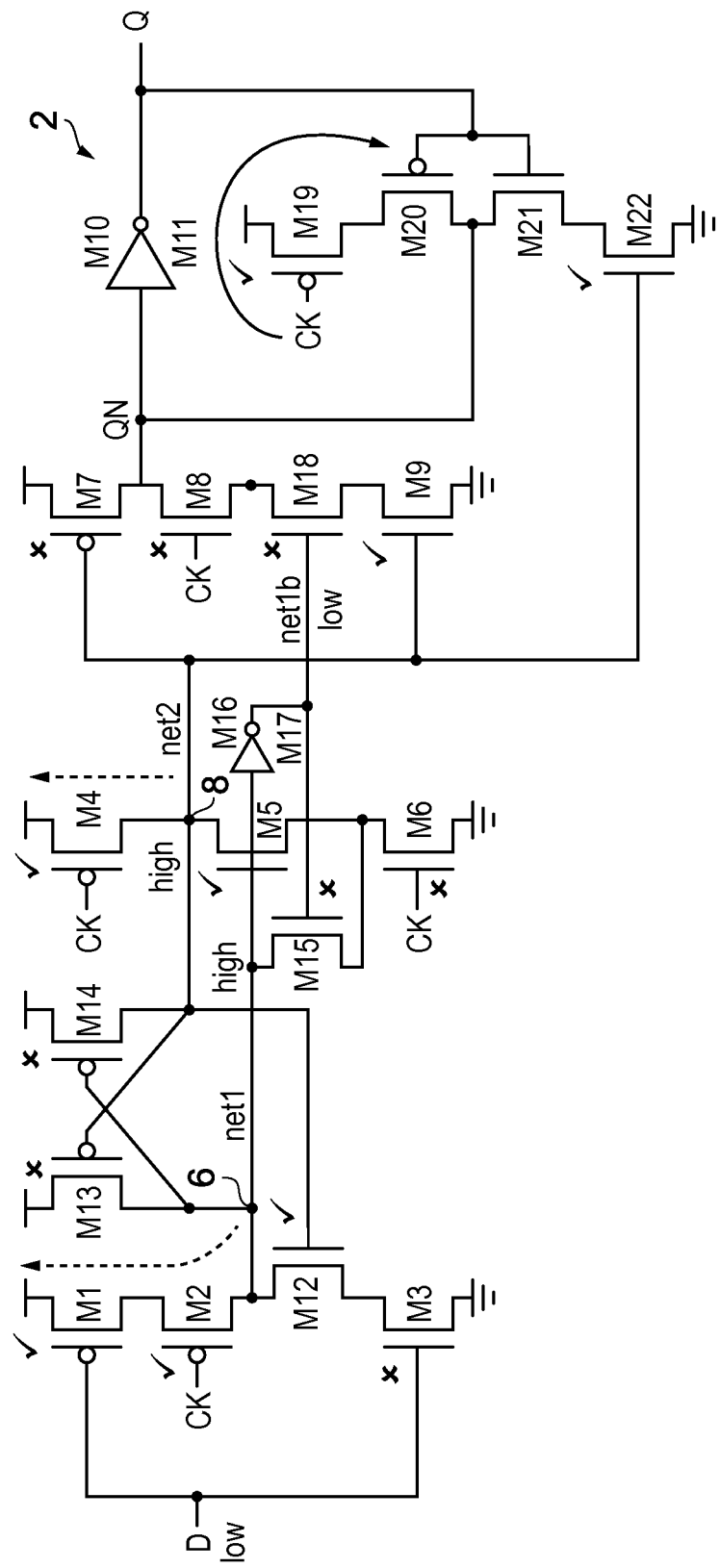

FIG. 5 illustrates the operation of the signal value storage circuitry 2 when the clock signal is low (first clock signal level) and the input signal D is low. During this period of operation, the primary node 6 is pulled high through action of the transistors M1 and M2 within the first transistor stack M1, M2, M12 and M3. As before, the secondary node 8 is precharged high through the transistor M4 within the second transistor stack M4, M5 and M6. Also during this period, the output feedback circuitry M19, M20, M21 and M22 serves to maintain the output signal Q at its existing signal level.

Figure 6:
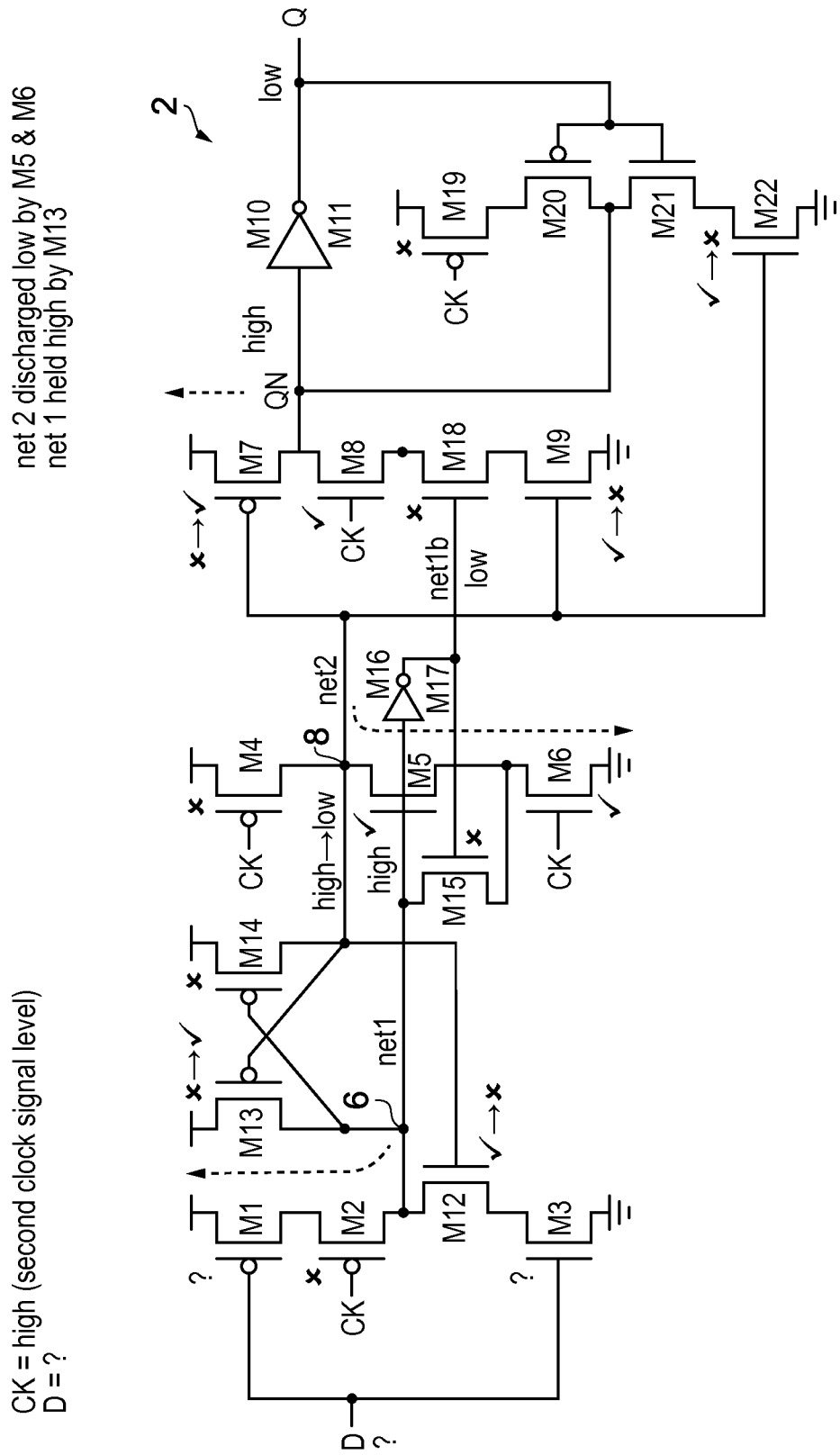

FIG. 6 illustrates the state of the signal value storage circuitry 2 when the clock signal CK becomes high (second clock signal level) following the state illustrated in FIG. 5 where the input signal D was low. During this period, the circuitry 2 is insensitive to the level of the input signal D, at least when the secondary node 8 has discharged so rendering the first-stack isolation transistor M12 non-conductive. During the period illustrated in FIG. 6, the secondary node 8 is discharged (changed from a high signal level to a low signal level) through transistors M5 and M6 within the second transistor stack M4, M5 and M6. At the same time, the first primary-node keeper transistor M13 serves to hold the primary node 6 high once the secondary node 8 has been discharged so turning on the first primary-node keeper transistor M13 through its gate electrode.

The discharge of the secondary node 8 from high to low acts through the third transistor stack M7, M8, M18 and M9 to pull the node QN high and accordingly drive the signal output Q low. During the period illustrated in FIG. 5, the output feedback circuitry M19, M20, M21 and M22 is disabled (at least when the secondary node 8 has discharged).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Signal value storage circuitry comprising:
a signal input configured to receive an input signal value;
a signal output configured to output an output signal value;
a clock signal input configured to receive a single clock signal varying between a first clock signal level and a second clock signal level;
a first transistor stack, coupled to said signal input and to said clock signal input, is configured to drive a primary node bearing a primary node signal to a primary node signal level dependent upon said input signal value while said single clock signal has said first clock signal level;
a second transistor stack, coupled to said primary node and to said clock signal input, is configured to charge a secondary node bearing a secondary node signal to a charged signal level while said single clock signal has said first clock signal level and, while said single clock signal has said second clock signal level, one of (i) to discharge said secondary node to a discharged signal level if said primary node signal has a first signal level, and (ii) not to discharge said secondary node if said primary node signal has a second signal level;
a third transistor stack, coupled to said secondary node, to said clock signal input and to said signal output, is configured to drive said output signal value while said clock signal has said second clock signal level to one of: (i) a first output signal level if said secondary node is at said charged signal level, and (ii) a second output signal level if said secondary node is at said discharged signal level;
a secondary-node keeper transistor, coupled to said primary node and to said secondary node, is configured (i) to drive said secondary node to maintain said charged signal level when said primary node signal has said second signal level and (ii) not to drive said secondary node when said primary node signal has said first signal level; and a first primary-node keeper transistor, coupled to said primary node and to said secondary node, is configured (i) to drive said primary node to maintain said first signal level when said secondary node is at said discharged signal level and (ii) to not drive said primary node when said secondary node signal is at said charged signal level.

2. Signal value storage circuitry as claimed in claim 1, comprising:
a second primary-node keeper transistor, coupled to said primary node and to said second transistor stack, is configured (i) while said single clock signal has said second clock signal level, to drive said primary node to maintain said second signal level when said primary node is at said second signal level and (ii) while said single clock signal has said first clock signal level, to not drive said primary node.

3. Signal value storage circuitry as claimed in claim 1, wherein
said third transistor stack includes a third-stack isolation transistor, coupled to said primary node, configured to prevent said third transistor stack driving said signal output toward said first output signal level while said secondary node is discharged from said charged signal level to said discharged signal level.

4. Signal value storage circuitry as claimed in claim 1, comprising:
output feedback circuitry, coupled to said signal output, configured to maintain said output signal at a current level while said single clock signal has said first clock signal level and to permit said output signal to change while said single clock signal has said second clock signal level.

5. Signal value storage circuitry comprising:
a signal input configured to receive an input signal value,
a signal input configured to output an output signal value,
a clock signal input configured to receive a single clock signal varying between a first clock signal level and a second clock signal level;
a first transistor stack, coupled to said signal input and to said clock signal input, is configured to drive a primary node bearing a primary node signal to a primary node signal level dependent upon said input signal value while said single clock signal has said first clock signal level;
a second transistor stack, coupled to said primary node and to said clock signal input, is configured to charge a secondary node bearing a secondary node signal to a charged signal level while said single clock signal has said first clock signal level and, while said single clock signal has said second clock signal level, one of (i) to discharge said secondary node to a discharged signal level if said primary node signal has a first signal level, and (ii) not to discharge said secondary node if said primary node signal has a second signal level;
a third transistor stack, coupled to said secondary node, to said clock signal input and to said signal output, is configured to drive said output signal value while said clock signal has said second clock signal level to one of: (i) a first output signal level is said secondary node is at said charged signal level, and (ii) a second output signal level if said secondary node is at said discharged signal level; and
a secondary-node keeper transistor, coupled to said primary node and to said secondary node, is configured (i) to drive said secondary node to maintain said charged signal level when said primary node signal has said second signal level and (ii) not to drive said secondary node when said primary node signal has said first signal level, wherein said first transistor stack includes a first-stack isolation transistor, coupled to said secondary node, configured to prevent said first transistor stack driving said primary node to said second signal level when said secondary node is at said discharged signal level.

6. A method of storing a signal value within signal value storage circuitry, said method comprising the steps of:
receiving an input signal value at a signal input;
receiving at a clock signal input a single clock signal varying between a first clock signal level and a second clock signal level;
driving, with a first transistor stack coupled to said signal input and to said clock signal input, a primary node bearing a primary node signal to a primary node signal level dependent upon said input signal value while said single clock signal has said first clock signal level;
charging, with a second transistor stack coupled to said primary node and to said clock signal input, a secondary node bearing a secondary node signal to a charged signal level while said single clock signal has said first clock signal level and, while said single clock signal has said second clock signal level, one of (i) discharging said secondary node to a discharged signal level if said primary node signal has a first signal level, and (ii) not discharging said secondary node if said primary node signal has a second signal level;
driving, with a third transistor stack coupled to said secondary node, to said clock signal input and to a signal output, an output signal value while said clock signal has said second clock signal level to one of: (i) a first output signal level if said secondary node is at said charged signal level, and (ii) a second output signal level if said secondary node is at said discharged signal level;
outputting said output signal value at said signal output; and
with a secondary-node keeper transistor coupled to said primary node and to said secondary node (i) driving said secondary node to maintain said charged signal level when said primary node signal has said second signal level and (ii) not driving said secondary node when said primary node signal has said first signal level, with a third-stack isolation transistor within said third transistor stack and coupled to said primary node, preventing said third transistor stack driving said signal output toward said first output signal level while said secondary node is discharged from said charged signal level to said discharged signal level.

7. A method as claimed in claim 6, comprising:
with a first primary-node keeper transistor coupled to said primary node and to said secondary node, (i) driving said primary node to maintain said first signal level when said secondary node is at said discharged signal level and (ii) not driving said primary node when said secondary node signal is at said charged signal level.

8. A method as claimed in claim 6, comprising:
with a second primary-node keeper transistor coupled to said primary node and to said second transistor stack, (i) while said single clock signal has said second clock signal level, driving said primary node to maintain said second signal level when said primary node is at said second signal level and (ii) while said single clock signal has said first clock signal level, not driving said primary node.

9. A method as claimed in claim 6, comprising:
with a first-stack isolation transistor within said first transistor stack and coupled to said secondary node, preventing said first transistor stack driving said primary node to said second signal level when said secondary node is at said discharged signal level.

10. A method as claimed in claim 6, comprising:
with output feedback circuitry coupled to said signal output, maintaining said output signal at a current level while said single clock signal has said first clock signal level and permitting said output signal to change while said single clock signal has said second clock signal level.

* * * * *